United States Patent [19]

Si et al.

[11] Patent Number: 4,752,907

[45] Date of Patent: Jun. 21, 1988

[54] INTEGRATED CIRCUIT SCANNING APPARATUS HAVING SCANNING DATA LINES FOR CONNECTING SELECTED DATA LOCATIONS TO AN I/O TERMINAL

[75] Inventors: Stephen S. C. Si, Milpitas; James B. Shackleford, Sunnyvale, both of Calif.; Daryl H. Allred, Fort Collins, Colo.

[73] Assignee: Amdahl Corporation, Sunnyvale, Calif.

[21] Appl. No.: 880,106

[22] Filed: Jun. 30, 1986

Related U.S. Application Data

[63] Continuation of Ser. No. 784,176, Oct. 4, 1985, abandoned, which is a continuation of Ser. No. 528,162, Aug. 31, 1983, abandoned.

[51] Int. Cl.$^4$ .............. G06F 15/00; G06F 11/00
[52] U.S. Cl. ........................... 364/900; 371/25; 324/73 R; 340/825.1
[58] Field of Search ... 364/200 MS File, 900 MS File; 371/25, 26; 324/73 R; 365/130, 230, 239; 340/825.06, 825.08, 825.1, 825.16

[56] References Cited

U.S. PATENT DOCUMENTS

| | | | |
|---|---|---|---|
| 4,055,754 | 10/1977 | Chesley | 371/21 |
| 4,087,092 | 8/1978 | Krause et al. | 273/138 R |
| 4,120,048 | 10/1978 | Fuhrman | 365/239 |
| 4,130,900 | 12/1978 | Watanabe | 365/230 |
| 4,225,945 | 9/1980 | Schuller | 365/239 |
| 4,404,519 | 9/1983 | Westcott | 324/73 R |
| 4,414,665 | 11/1983 | Kimura et al. | 371/21 |
| 4,441,075 | 4/1984 | McMahon | 324/73 R |
| 4,447,895 | 5/1984 | Asano et al. | 365/230 |
| 4,472,792 | 9/1984 | Shimoligashi et al. | 365/230 |
| 4,608,690 | 8/1986 | Judge | 364/900 |

FOREIGN PATENT DOCUMENTS

0090270 7/1981 Japan .................. 324/73 R

OTHER PUBLICATIONS

Neil Berglund: "Level Sensitive Scan Design, Test Chips, Boards, System", Electronics, Mar. 15, 1979, pp. 108–110.
W. H. McAnney: "Method for Sampling Test Points in Logic Circuits", IBM Technical Disclosure Bulletin, vol. 25, No. 9, Feb., 1983, pp. 4519–4520.
Williams et al., "Random Patterns within a Structured Sequential Logic Design", 1977 Semiconductor Test Symposium, pp. 19–27.
James Stewart, "Application of Scan/Set for Error Detection and Diagnostics", 1978 Semiconductor Test Symposium, pp. 152–158.

Primary Examiner—Archie E. Williams, Jr.
Assistant Examiner—Thomas C. Lee
Attorney, Agent, or Firm—Fliesler, Dubb, Meyer & Lovejoy

[57] ABSTRACT

A scan apparatus provides an interface and control signals between a secondary computer and data locations in a host computer. The scan apparatus functions independently of the normal operation of the host computer. Scan-out is performed transparently to the operation of the host computer. The host computer is constructed using circuits on semiconductor chips. The semiconductor chips are organized in blocks. Chips within each block include scan apparatus which controls the scan operations in connection with that chip. The scan apparatus in each chip is connected through two I/O pins to a clock lines and to a bidirectional scan data line. The scan apparatus on each chip includes a multimode sequencer so that each chip in each block can be independently performing scan sequences. The block scan apparatus and the secondary computer perform the functions of requesting a scan sequence for transmitting the scan data.

4 Claims, 7 Drawing Sheets

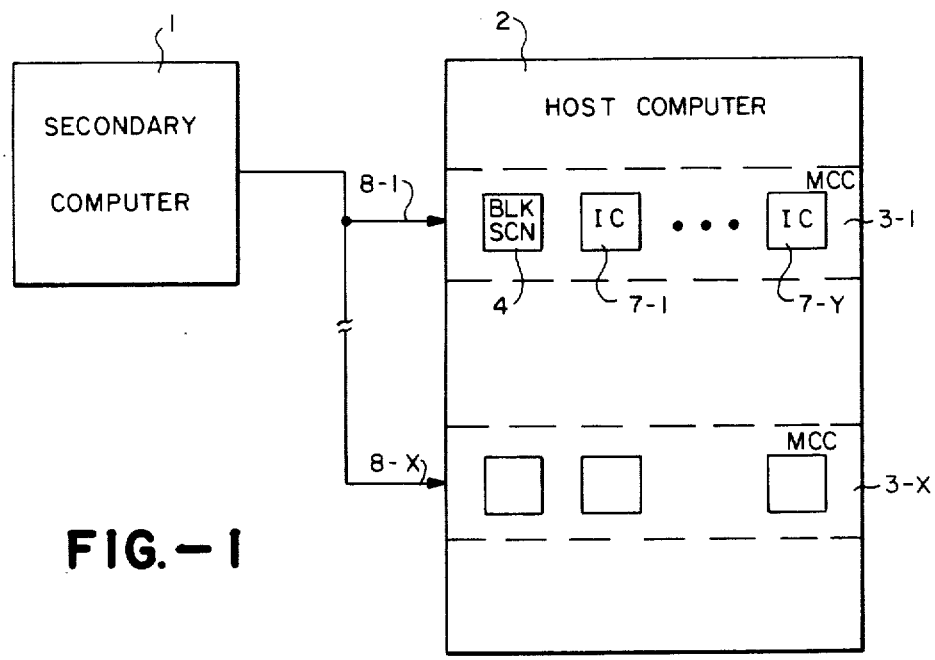
FIG.—1
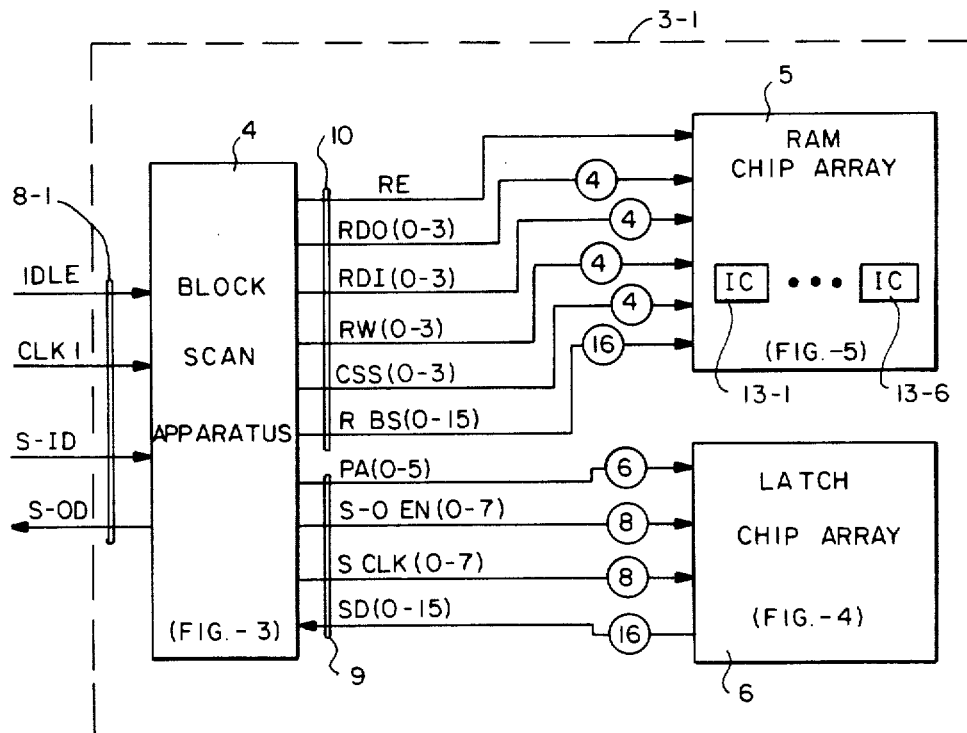
FIG.—2

INTEGRATED CIRCUIT SCANNING APPARATUS HAVING SCANNING DATA LINES FOR CONNECTING SELECTED DATA LOCATIONS TO AN I/O TERMINAL

This is a continuation of Ser. No. 784,176, filed Oct. 4, 1985, now abandoned, which is a continuation of Ser. No. 528,162, filed Aug. 31, 1983, now abandoned.

BACKGROUND OF THE INVENTION

The present invention relates to the field of data processing systems and more particularly to scan apparatus for accessing locations in the data processing system to facilitate testing and diagnostics. In the prior art, scan-in and scan-out (scan) has been accomplished by a number of approaches.

One approach connects the internal latches into a shift register. The shift register is formed using the machine latches which are used for normal processing. Such systems have not supported scan (scan-in or scan-out) of memory elements (RAMs), and have not preserved the original content of latches during scanout.

Another approach connects many internal data locations to a large multiplexor. With a large multiplexor, the internal data locations are accessible in parallel independently of the normal data paths of the system. However, with a multiplexor, the parallel scan approach has used an excessive number of chip input/output (I/O) pins.

One prior art data processing system that has included scan capabilities is described in U.S. Pat. No. 4,244,019 entitled "Data Processing System Including A Program-Executing Secondary System Controlling A Program-Executing Primary System" assigned to the same assignee as the present invention.

The U.S. Pat. No. 4,244,019 provides a mechanism for scan of designed locations within a data processing system, independently of the normal data paths of that system. The scan techniques described in that patent have proved very useful. However, for data processing systems with greater chip densities, there is a need for more powerful scan apparatus which is more flexible and capable of more complex operations.

Advances in large-scale integration (LSI) circuit densities have caused the circuit input/out (I/O) pin ratio to increase. With increased circuit density, a single I/O pin on a chip has a much greater relative importance than with the previous generations of LSI technology. Accordingly, relatively abundant internal circuits can be used in a manner which reduces the need for the number of relatively scarce I/O pins have considerable economic value.

In accordance with the above background, there is a need for an improved scan apparatus for use in data processing systems.

SUMMARY OF INVENTION

The present invention is a scan apparatus which provides an interface and control signals between a secondary computer and data locations in a host computer. The scan apparatus functions independently of the normal operation of the host computer. Scan-out is performed transparently to the operation of the host computer. The host computer is constructed using circuits on semiconductor chips. The semiconductor chips are organized in blocks. Chips within each block include scan apparatus which controls the scan operations in connection with that chip. The scan apparatus in each chip is connected through I/O pins to a clock lines and to a bidirectional scan data line. The scan apparatus on each chip includes a multimode sequencer so that each chip in each block can be independently performing scan sequences. The block scan apparatus and the secondary computer perform the functions of requesting a scan sequence for transmitting the scan data.

The scan sequences on each chip typically include a scan-in mode and a scan-out mode for latches.

The scan apparatus of the present invention is for serial scan operations which require only two I/O pins on a chip. With only two I/O pins, selective scan-in reset, non-destructive scan-out, and other functions are possible.

In accordance with the above summary, the present invention achieves the objective of providing an improved scan apparatus capable of greater flexibility while requiring only a small number of I/O pins.

The foregoing and other objects, features and advantages of the invention will be apparent from the following detailed description in conjunction with the drawings.

BRIEF DESCRIPTION OF THE DRAWINGS

FIG. 1 depicts a representation of a host computer formed by a number of blocks each having a scan apparatus connected to a secondary computer in accordance with the present invention.

FIG. 2 depicts a representation of one block of the FIG. 1 system having a block scan apparatus.

DETAILED DESCRIPTION

Overall System—FIG. 1

Figure 3:
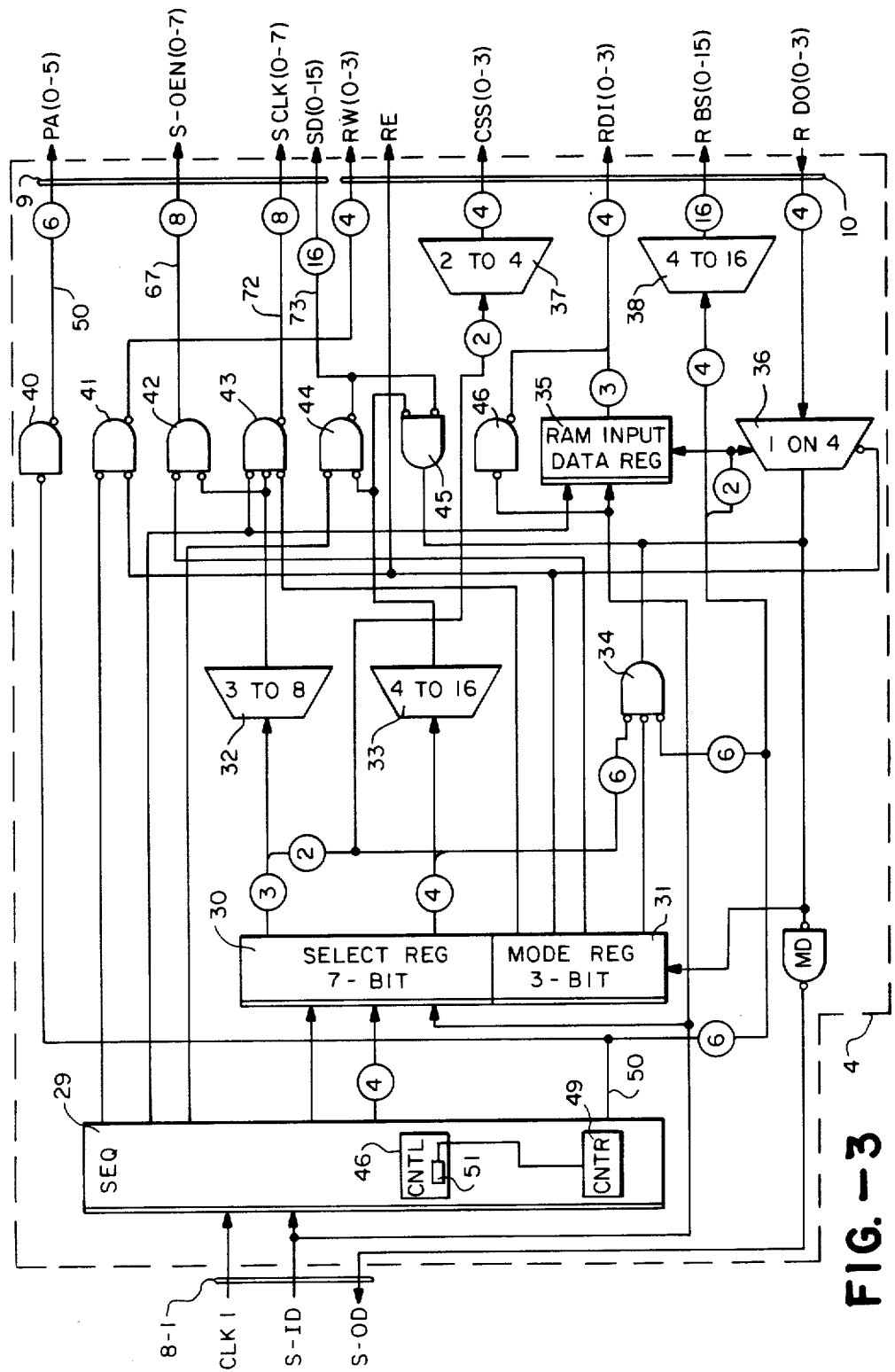
FIG. 3 depicts a representation of the block scan apparatus within the block of FIG. 2.

In FIG. 1, a secondary computer 1 is connected to a host computer 2. The host computer 2 is partitioned into a number of blocks 3-1, . . . , 3-X. In FIG. 1, the block 3-1 is typical of each of the blocks 3-1, . . . , 3-X. Typically, the blocks 3-1 through 3-X include a number of integrated circuit chips, where chips 7-1, . . . , 7-Y in block 3-1 are typical. In one arrangement, the block 3-1 is a multiple chip carrier (MCC) which physically carries the chips 7-1 through 7-Y. Also, the block 3-1 includes an additional chip which includes the block scan apparatus 4 and which interfaces between the secondary computer 1 and the host computer chips 7-1 through 7-Y.

Block—FIG. 2

In FIG. 2, a schematic representation of the scan circuitry organization for block 3-1 of FIG. 1 is shown. The circuitry includes a RAM array 5 which is formed by one or more of the chips 7-1 through 7-Y and the latch chip array 6 which is formed by other ones of the chips 7-1 through 7-Y.

The block scan apparatus 4 communicates through lines 8-1 with the secondary computer 1 of FIG. 1 and through lines 9 and 10 with the latch and RAM arrays. The lines 9 connect from the scan apparatus 4 to various latch chips throughout the block 3-1 of the host computer and which are represented by latch chip array 6. The lines 10 connect to various control stores which are part of the RAM array 5 and which are located throughout the block 3-1 of the host computer.

In FIG. 2, the three lines 8-1 include the clock line, CLK 1, include the scan-in data line, S-ID, and include the scan-out data line, S-OD.

The latch lines 9 include the parallel address lines, PA(0:5), include the scan-out enable lines, S-OEN(0:15), include the scan clock lines, SCLK(0:7), and include the scan data lines, SD(0:15).

The RAM lines 10 include the RAM Enable line, RE, include the RAM data outlines, RDO(0:3), include the RAM data-in lines, RDI(0:3), include the RAM write lines, RW(0:n), include the control store select lines, CSS(0:n), and include the RAM block select lines, RBS(0:15).

In one particular embodiment, the latch chip array 6 is a 128-chip array, having 16 columns and 8 rows of chips. In one particular embodiment, the number of scan control stores is four, but any number up to 128 can be employed.

Block Scan Apparatus—FIG. 3

In FIG. 3, a block diagram of the block scan apparatus 4 of FIG. 2 is shown. The block scan apparatus 4 connects to the lines 8-1 on the left and connects to the latch lines 9 and the RAM lines 10 on the right.

In FIG. 3, the sequencer 29 is a device for stepping through periodic sequences. For example, sequencer 29 includes a 6-bit counter 49 which counts under control of control logic 46 which has eleven control states. Control logic 46 includes a 4-bit counter 51, state logic, hereinafter explained for defining several different modes. Sequencer 29 provides the sequential output signals which are used in conjunction with the rest of the circuitry of FIG. 3 to provide multiple modes of scan operation.

The line, CLK1, provides clock timing to the sequencer 29 from computer 1. Two pulses on the CLK1 line correspond to one 'Scan-Clock'. The scan-in data line (S-ID) supplies serial data and control information to the sequencer 29 and the scan apparatus for transfer to the latch chip array 6 or RAM chip array 5 of FIG. 2. The scan-out data line (S-OD) sends scan out data from the block scan apparatus 4 to the computer 1.

In one embodiment, the block scan apparatus 4, under control of sequencer 29, operates in five different modes:

1. Latch scan-in mode.
2. Latch scan-out mode.
3. RAM scan-in mode.
4. RAM scan-out mode.
5. Diagnostics mode.

The bit fields for each of the above modes are represented in the following TABLES 1-5.

TABLE 1

| | MODE | | | | ADDRESS | | | LATCH SCAN-IN | | | | | DATA | | | | |
|---|---|---|---|---|---|---|---|---|---|---|---|---|---|---|---|---|---|
| S | M1 | M2 | M3 | C0 | C1 | C2 | C3 | R0 | R1 | R2 | | | | | | | |
| 0 | 0 | 1 | 0 | 1/0 | 1/0 | 1/0 | 1/0 | 1/0 | 1/0 | 1/0 | X | X | 1/0 | 1/0 | 1/0 | 1/0 | 1/0 |
| 0 | 1 | 2 | 3 | 4 | 5 | 6 | 7 | 8 | 9 | 10 | 11 | 12 | 13 | 14 | 15 | ... 73 | 74 |

S = 0 = START
S = 1 = IDLE
M1 = 0 = NORMAL MODE
M2 = 1 = SCAN-IN MODE
M3 = 0 = LATCH MODE
X = DON'T CARE
C = COLUMN SELECT
R = ROW SELECT

TABLE 2

| | MODE | | | | ADDRESS | | | LATCH SCAN-OUT | | | | | DATA | | | | |
|---|---|---|---|---|---|---|---|---|---|---|---|---|---|---|---|---|---|
| S | M1 | M2 | M3 | C0 | C1 | C2 | C3 | R0 | R1 | R2 | | | | | | | |
| 0 | 0 | 0 | 0 | 1/0 | 1/0 | 1/0 | 1/0 | 1/0 | 1/0 | 1/0 | X | X | X | X | X | X | X |
| 0 | 1 | 2 | 3 | 4 | 5 | 6 | 7 | 8 | 9 | 10 | 11 | 12 | 13 | 14 | 15 | ... 73 | 74 |

S = 0 = START
M1 = 0 = NORMAL MODE
M2 = 0 = SCAN-OUT MODE
M3 = 0 = LATCH MODE
X = DON'T CARE

TABLE 3

| | MODE | | | | ADDRESS | | | RAM SCAN-IN | | | | | DATA | | | | |
|---|---|---|---|---|---|---|---|---|---|---|---|---|---|---|---|---|---|
| S | M1 | M2 | M3 | CS0 | CS1 | CS2 | CS3 | CS4 | CS5 | CS6 | | | | | | | |
| 0 | 0 | 1 | 1 | 1/0 | 1/0 | 1/0 | 1/0 | 1/0 | 1/0 | 1/0 | 1/0 | 1/0 | 1/0 | 1/0 | 1/0 | 1/0 | 1/0 |
| 0 | 1 | 2 | 3 | 4 | 5 | 6 | 7 | 8 | 9 | 10 | 11 | 12 | 13 | 14 | 15 | ... 73 | 74 |

S = 0 = START
M1 = 0 = NORMAL MODE
M2 = 1 = SCAN-IN MODE
M3 = 1 = RAM MODE
CS(0:6) = CONTROL STORES SELECT (0:127)
X = DON'T CARE

TABLE 4

| MODE | | | | RAM SCAN-OUT ADDRESS | | | | | | | DATA | | | | | | | |
|---|---|---|---|---|---|---|---|---|---|---|---|---|---|---|---|---|---|---|
| S | M1 | M2 | M3 | CS0 | CS1 | CS2 | CS3 | CS4 | CS5 | CS6 | | | DATA | | | | | |
| 0 | 0 | 0 | 1 | I/0 | I/0 | I/0 | I/0 | I/0 | I/0 | I/0 | X | X | X | X | X | | X | X |
| 0 | 1 | 2 | 3 | 4 | 5 | 6 | 7 | 8 | 9 | 10 | 11 | 12 | 13 | 14 | 15 | ... | 73 | 74 |

S = 0 = START
M1 = 0 = NORMAL MODE
M2 = 0 = SCAN-OUT MODE
M3 = 1 = RAM MODE
CS(0:6) = CONTROL STORES SELECT (0:127)
X = DON'T CARE

TABLE 5

| MODE | | | | DIAGNOSTICS ADDRESS | | | | | | | DATA | | | | | | | |
|---|---|---|---|---|---|---|---|---|---|---|---|---|---|---|---|---|---|---|
| S | M1 | M2 | M3 | E1 | E2 | E3 | E4 | E5 | E6 | E7 | | | DATA | | | | | |
| 0 | 1 | I/0 | I/0 | I/0 | I/0 | I/0 | I/0 | I/0 | I/0 | I/0 | X | X | X | X | X | | X | X |
| 0 | 1 | 2 | 3 | 4 | 5 | 6 | 7 | 8 | 9 | 10 | 11 | 12 | 13 | 14 | 15 | ... | 73 | 74 |

M1 = 1 = DIAGNOSTIC MODE
M2 = VALUE ASSIGNED BY SECONDARY COMPUTER
M3 = VALUE ASSIGNED BY SECONDARY COMPUTER
E = VALUE ASSIGNED BY SECONDARY COMPUTER
X = DON'T CARE

One of the five modes of operation indicated in TABLES 1 to 5 is identified by a 3-bit mode register (MODE-REG) 31.

In FIG. 3, the SELECT-REG 30 is used to hold either the latch chip address or the control store address. Register 30 holds 7 bits and supports an address space of 128 latch chips or 128 groups of Scan-Control-Stores (group of RAM chips). In FIG. 3, an implementation that supports four Scan-Control-Stores is shown. A Scan-Control-Store is a whole or a part of a whole control store that can be accessed in one Scan-Sequence. Each Scan-Control-Store is not wider than 64 bits. Control stores wider than 64 bits are partitioned into groups of Scan-Control-Stores no wider than 64 bits.

For RAM scan, the content of the SELECT-REG 30 is used to select one Scan-Control-Store via the control of the RAM mode signal. The particular word to be scanned is addressed by the normal RAM Address Register, such as register 47 in FIG. 5, of the corresponding control store. The RAM Address Register can be set in a separate scan operation.

Figure 4:
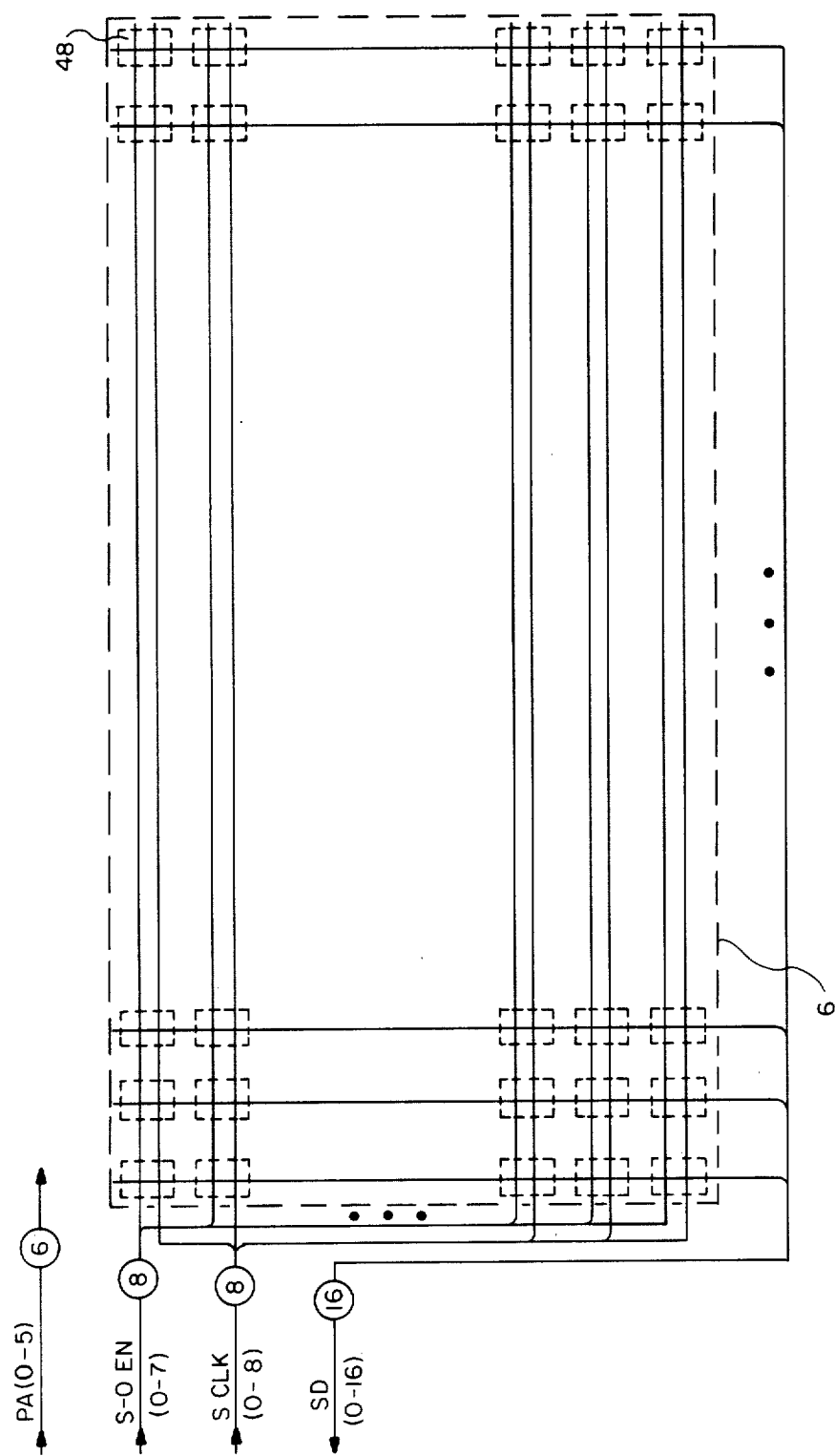
FIG. 4 depicts a latch chip array within the block of FIG. 2.

For latch scan, the contents of the SELECT-REG 30 uniquely identifies one chip on the MCC, such as chip 48 in FIG. 4.

Block Scan Sequencing

The block scan apparatus operates with a 75-state (75 Scan-Cycles) scan sequencer 29. The block scan sequencer supplies the control signals and scan clocks during a whole Block-Scan-Sequence. A block Scan Sequence consists of 11 control and addressing states, followed by a 64-state Chip-Scan-Sequence.

For latch scan, the first two of the 64 states of the Chip-Scan-Sequence are control states. These are reserved for controlling the 'Two-Pin' serial scan state machine on a latch chip (see FIG. 6). Chips with the two-pin serial scan machine will be called Serial Scan Chips (SSC). The remaining 62 states are used for data transfer.

For chips that are logic bound instead of I/O bound, the two-pin serial scan machine on the latch chip is replaced by a parallel scan machine which has a 9-line interface. The additional seven interface lines consist of six latch address lines 50, PA(0:5), and a mode line 67, S-O EN (indicates scan-in or scan-out). Chips which receive the 9-line interface are called Parallel-Scan-Chips.

For RAM scan, all the 64 states of the Chip-Scan-Sequence are used for data transfer.

Block Scan Initialization

Correct operation of the scan apparatus requires execution of an initialization procedure before normal scan operation can begin. This initialization procedure is only required after a power on or at a time when the scan sequencer 29 may be in an unknown state. The initialization procedure is a software routine from the computer 1 which will force the scan sequencer and the 'Serial Scan Machine' on all serial-scan latch chips into a known state.

The first step is to hold the scan-in data line (S-ID) high and issue a minimum of 75 scan clocks to force the block scan sequencer into the IDLE state. After the block scan sequencer is initialized, the serial scan machine on the latch chips can be initialized by a scan operation to each row of the chip array with the scan-in data line (S-ID) held high for a minimum of 64 scan clocks. This process is repeated for each of the eight rows of the scan latch chip array.

Block Scan-Out Operation

Once the block scan sequencer has been initialized, the sequencer will stay in the IDLE state (State-0) as long as the S-ID line is held high. Taking the S-ID line low for one scan clock will cause the block scan sequencer to start the 75 state sequence. In State 1, MODE-BIT-1 of the MODE-REG 30 which decides whether the normal mode operation (for latch or RAM scan) or diagnostic mode operation is set. In State 2, MODE-BIT-2 which selects the direction of data flow (scan-in or scan-out) is set. In State 3, MODE-BIT-3 which selects the RAM chip mode or the latch chip mode is set. After the three mode select states, the next seven states (State 4 to State 10) are used to transmit the selected address to the 7-bit SELECT-REG 30.

If the RAM mode is selected, the next 64 states (State 11 to State 74) are used to read data from the control store, four bits at a time, controlled by the block select signals, RBS, which change every four scan clocks.

Data scanned out from the RAM is connected to the RDO, line 10 of FIG. 3, and transferred to the computer 1 via the scan-out data line (S-OD).

If the latch mode is selected, States 11 and 12 are used to start the serial scan machine in the selected chip, and to transfer the mode information obtained in State 2 to the serial scan machine. If a parallel scan machine is employed, then the States 11 and 12 are not used because the information is transferred directly over the parallel interface. The last 62 states (State 13 to State 74) are used to transfer data from the latches on the chip to the computer 1 over the S-OD line.

Block Scan-In Operation

Latch scan-in operation is similar to the scan out operation except that data comes in on the scan-in data line, S-ID, from the computer 1 and transfers to the latch chip.

For RAM scan in operation, RAM write strobes will be provided every four scan cycles. Three bits of data will first be latched into the RAM INPUT-DATA-REG 35, the fourth data bit is supplied directly from the scan-in data line, S-ID, to form a 4-bit block. A RAM write strobe, RW, is then issued to cause this data to be written into the selected RAM.

Block Diagnostics Mode

The block scan apparatus 4 supports its own testing. The diagnostic mode is included to facilitate the testing.

During the diagnostic mode, the state of all the RAMs and LSI latches is not changed. In diagnostic mode, the 6-bit output on lines 50 from a counter 49 for the 64 states Chip-Scan-Sequence is combined with the SELECT-REG 30 and the MODE-REG 31 to form a unique signature, a 64-bit stream of 0's and 1's, according to the contents of the SELECT-REG 30 and the MODE-REG 31. The diagnostic data is returned back to the computer 1 for checking.

The contents of the SELECT-REG 30 and the contents of the MODE-REG 31 can be changed under control of the computer 1. In this way, the signature derived during the diagnostic mode of operation can be changed at will by computer 1. In this way, computer 1 can examine the condition of the block scan apparatus 4 to insure that it is operating properly or determine the nature of errors caused by the scan apparatus 4.

Chip Array—FIG. 4

In FIG. 4, further details of the 128-chip array 6 of latch chips 48 is shown. Each of the chips 48 in a row receives the same scan clock line. If it is a Parallel-Scan-Chip, the chips receive the same scan-out enable line. Each of the chips in a column connects to the scan data line. Any one of the Parallel-Scan-Chips receives the 6-bit parallel address lines, PA(0:5). With this parallel addressing, up to 62 different locations are addressed on each chip which receives the address lines. Only 62 addressable locations are addressed in order to make the Parallel-Scan-Chip compatible with the Serial-Scan-Chip which is limited to 62 serially addressed locations.

The Parallel-Scan-Chip requires nine I/O pins. The Serial-Scan-Chip requires only two I/O pins, namely SCAN DATA (bidirectional) and SCAN CLK.

Figure 5:
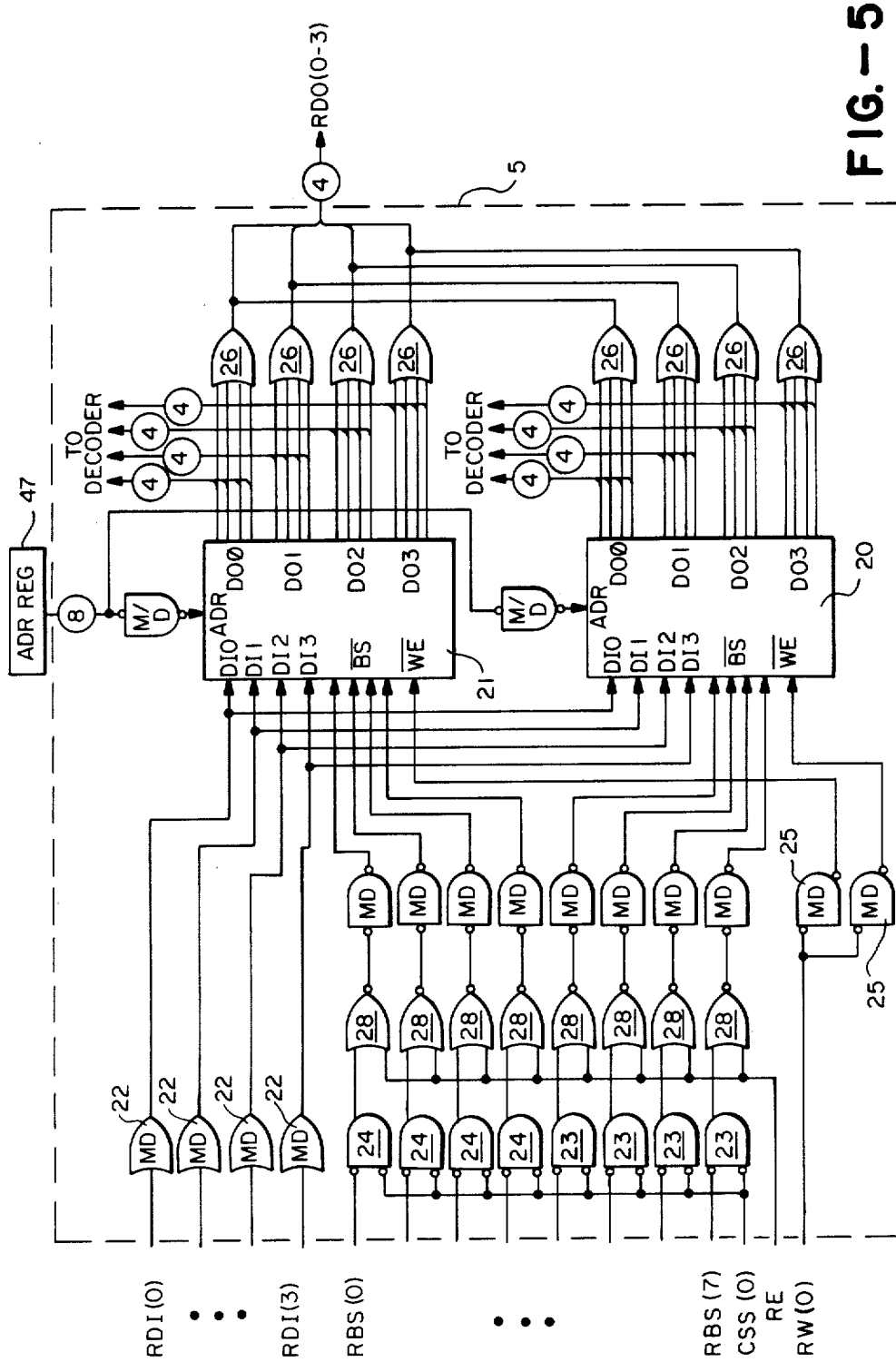
FIG. 5 depicts a typical RAM array within the block of FIG. 2.

RAM Array—FIG. 5

In FIG. 5, a typical example of how the RAM lines 10 of FIG. 2 connect to a RAM 20 and to a RAM 21 is shown. The data-in lines, RDI(0:3), connect through the gates 22 to the data inputs of both RAM 20 and RAM 21. The block select lines, RBS (0:3), connect through the gates 24 to the block select inputs of RAM 21. The block select lines, RBS(4:7), connect through the gates 23 to the block select inputs of the RAM 20. The gates 23 and 24 are enabled by the control store select line, CSS(0). The RAM enable line, RE, connects through gates 28 to the block select input to overwrite the RBS signals under normal operation. The RAM write line, RW(0), connects through the gates 25 to the write enable inputs of both RAM 20 and RAM 21.

The data outputs from the RAM 20 and RAM 21 connect through gates 26 to form the RAM outputs RDO(0:3).

The connections to the data locations shown in FIG. 4 and FIG. 5 are within the host computer and are in addition to the normal data and control paths which connect to and use the latches and RAM's.

The manner in which both normal connections (not shown) and the scan connections are made to the same latch circuits is described in connection with the latch circuit of FIG. 7.

Figure 6:
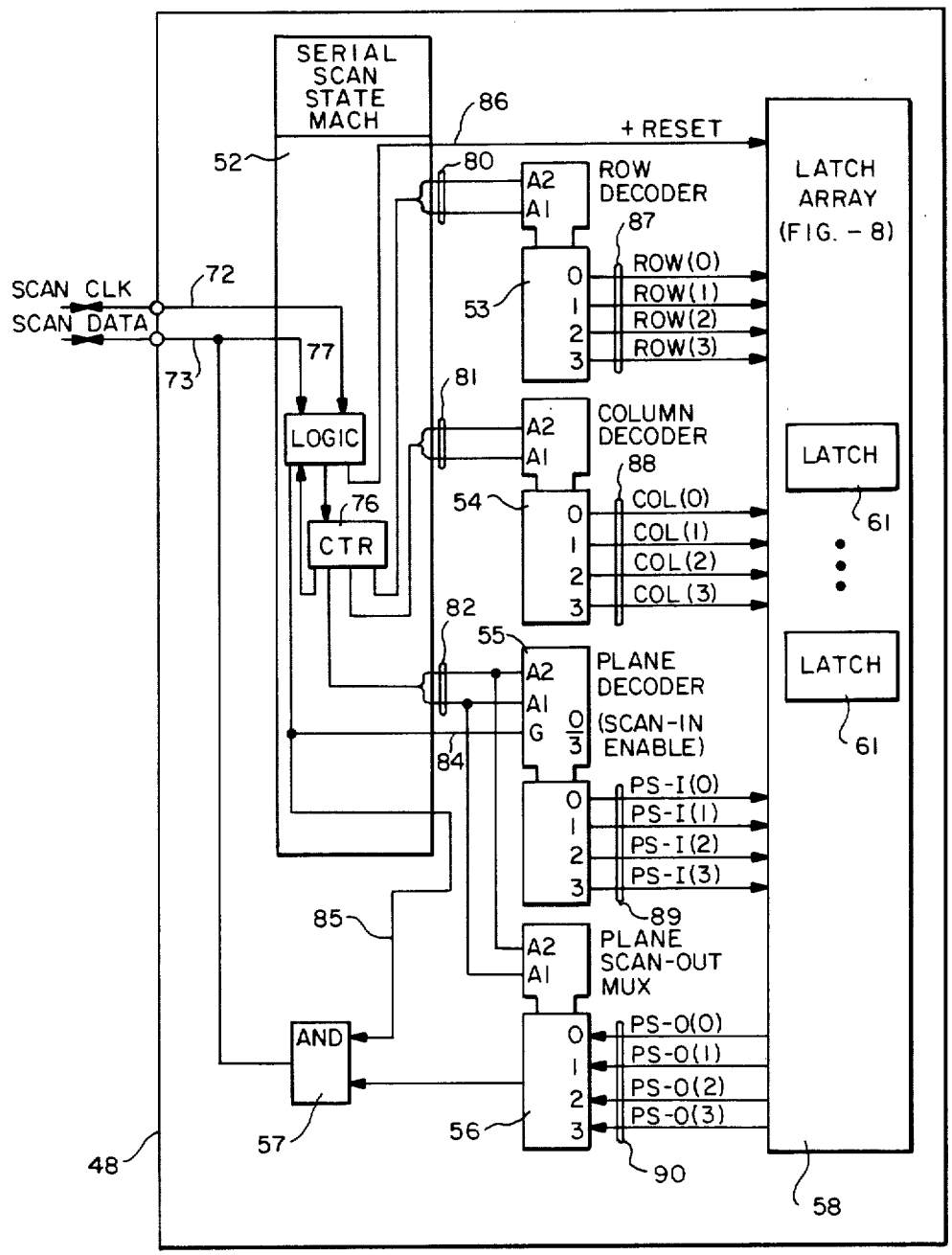
FIG. 6 depicts a serial I/O latch chip.

Latch Chip—FIG. 6

In FIG. 6, details of a Serial-Scan-Chip 48, typical of each of the latch chips in the latch chip array of FIG. 4, is shown. In FIG. 6, the chip 48 receives only two inputs, namely, SCAN CLK and SCAN DATA. These inputs on lines 72 and 73 connect to the serial latch chip sequencer 52. Chip sequencer 52 is similar to the block (MCC) sequencer 29 of FIG. 3. Chip sequencer 52 includes a 6-bit counter 76 and control logic 77. The 6-bit counter 76 corresponds to the 6-bit counter 49 in the block sequencer 29. The counter 49 provides the parallel address bus 50 of FIG. 3 which connects to Parallel-Scan-Chips. The Serial-Scan-Chips do not receive the parallel address bus 50. In place of the address bus 50, the chip sequencer 52 includes the 6-bit counter 76 which provides a 6-bit output in three pairs of outputs. The first pair is the row address lines 80 which connect to the row decoder 53. The second pair is the column address lines 81 which connect to the column decoder 54 and the third pair is the plane address lines 82 which connect to the plane scan-in decoder 55.

The chip sequencer 52 includes the state logic 77 which causes the sequencer 52 to be sequenced through various states, hereinafter described. The logic 77 receives the input lines 72 and 73 and provides the SCAN-IN ENABLE line 84 to the decoder 55 and provides the SCAN-OUT ENABLE line 85 to the AND gate 57. AND gate 57 receives the scan-out line from the scan-out multiplexor 56. Multiplexor 56 receives the plane address lines 82. When enabled by line 85, AND gate 57 provides the scan-out data to the SCAN DATA line 73.

In FIG. 6, the logic 77 also provides the single reset line 86, + RESET. The RESET line 86 connects to the latch array 58.

The latch array 58 also receives the four row decode lines 87, ROW(0), . . . , ROW(3). Array 58 receives the four column decode lines 88, COL(0), . . . COL(3). Latch array 58 receives the four plane scan-in lines 89, PS-I(0), . . . , PS-I(3). The latch array 58 provides the four plane scan-out lines 90, PS-O(0), . . . , PS-O(3).

In FIG. 6, the latch array 58 includes a plurality of latches 61 which are organized into four planes where each plane includes up to four rows of four columns each.

Figure 7:
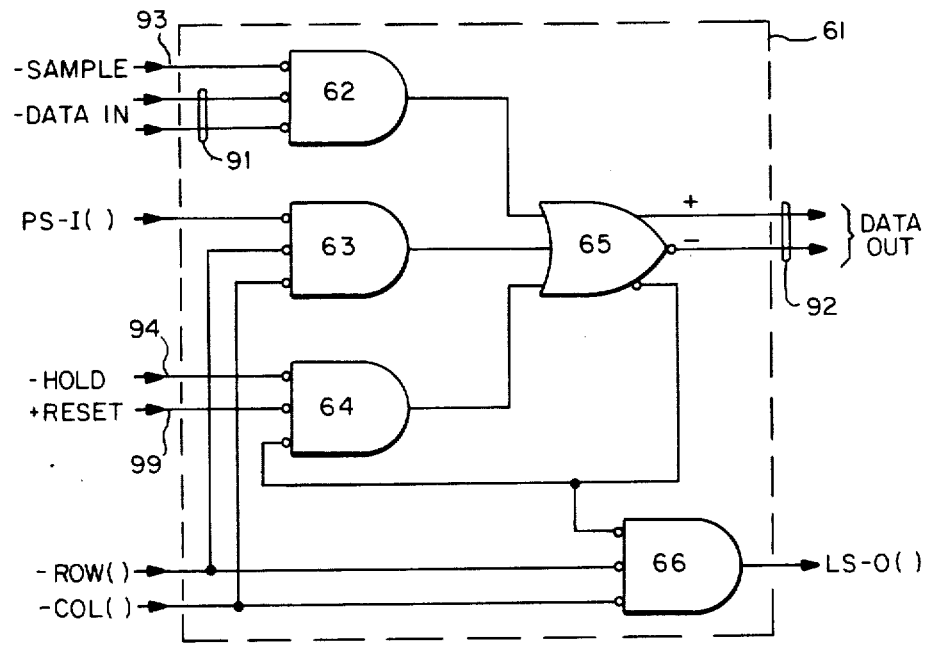
FIG. 7 depicts a typical latch within the latch chip of FIG. 6.

Latch Circuit—FIG. 7

In FIG. 7, a latch circuit 61 is shown which is typical of the latch circuits within the latch array 58 of FIG. 6. In FIG. 7, the latch circuit includes three AND gates 62, 63 and 64 which each provides an input to the OR gate 65. The normal data path within the principal apparatus of the host computer 2 of FIG. 1 utilizes the DATA-IN lines 91 and the DATA-OUT lines 92. Also, the normal data paths employ the clock SAMPLE input on line 93 and clock HOLD input on line 94. In this way, a conventional sample and hold latch with normal data inputs and normal data outputs is provided. In addition, the latch 61 of FIG. 7 receives the ROW() and the COL() signals as inputs to the gate 63 for use in scan-in operations. The ROW() and the COL() lines also connect to the scan-out AND gate 66. Gate 66 provides the latch scan-out signal, LS-O().

The AND gate 63 also receives the plane scan-in signal PS-I() to scan-in to the latches in a plane.

In FIG. 7, the signal lines ending in the symbol "()" indicate that they are one of the signals where the numbers "0, 1, 2 or 3" can be placed in the parenthesis to indicate one of the exact signal lines. For example, the signal ROW() in FIG. 7 can represent any one of the four signals ROW(0), . . . , ROW(3) from the road decoder 53 of FIG. 6.

Figure 8:
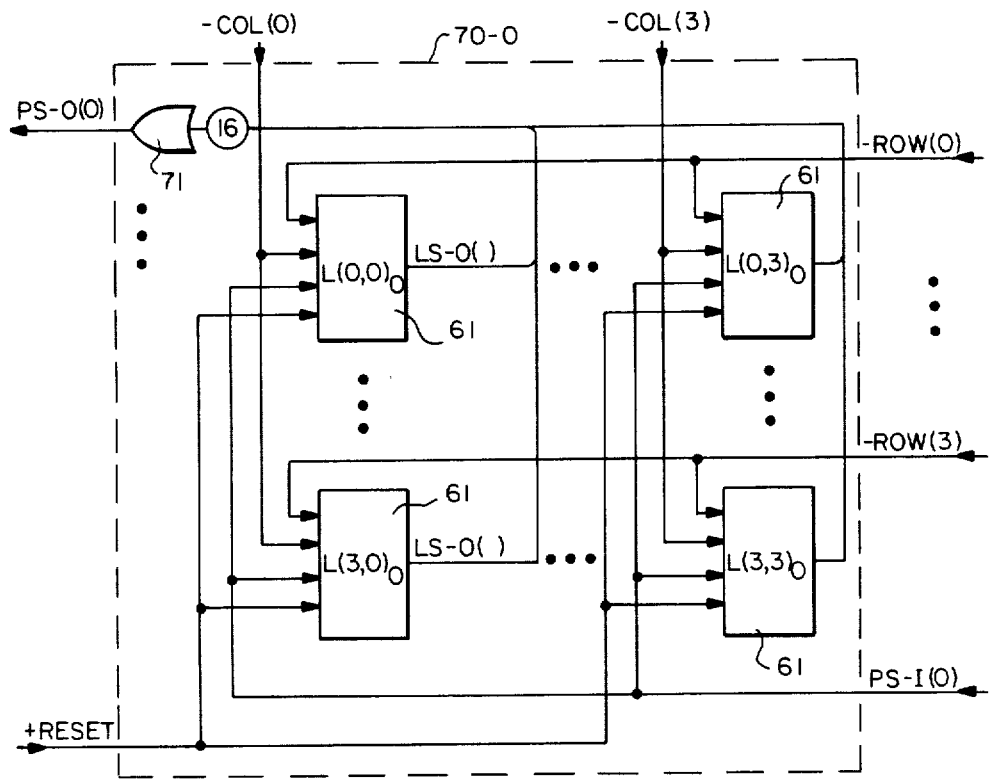
FIG. 8 depicts an array of the FIG. 7 latches organized in a single plane.

Single Plane Array—FIG. 8

In FIG. 8, a number of the latches 61 of FIG. 7 are arrayed in rows and columns. Specifically, a four-by-four row by column array is shown. The latches 61 in the first row are L(0,0)$_0$, . . . , L(0,3)$_0$. The second row (not shown) includes the latches L(1,0)$_0$, . . . , L(1,3)$_0$. The third row includes the latches L(2,0)$_0$, . . . , L(2,3)$_0$. Finally, the fourth row includes the latches L(3,0)$_0$, . . . , L(3,3)$_0$. Each of the latches in the first row receives the ROW(0) line from the decoder 53 of FIG. 6. Similarly, the ROW 1 receives the ROW(1) line from decoder 53, the ROW 2 latches receives the ROW(2) line from decoder 53 and the ROW 3 latches receives the ROW(3) line from decoder 53.

In FIG. 8, the plane of latches 70-0 has the column lines 88 from decoder 54 of FIG. 6 connected to the columns of latches. For example, the COL(0) line connects to the latches 61 in a column, namely to latches L(0,0)$_0$, . . . , L(3,0)$_0$. Similarly, the line COL(3) connects to the latches 61 in a column, namely, L(0,3)$_0$, . . . , L(3,3)$_0$.

The scan-in line, PS-I(0), connects to all of the latches in the plane 70-0. Similarly, the RESET line connects to all of the latches in the latch plane 70-0. The scan-out line, LS-O(), for each of the latches 61 in the latch plane 70-0 connects as an input to the 16-way OR gate 71. For example, the scan-out line LS-O(0,0)$_0$ from the latch L(0,0)$_0$ connects as one input to the OR gate 71. The OR gate 71 combines with a logical OR all of the scan-out lines from the plane to form the plane scan-out signal PS-O(0) which is one of the four inputs to the scan-out multiplexor 56 in FIG. 6.

Figure 9:
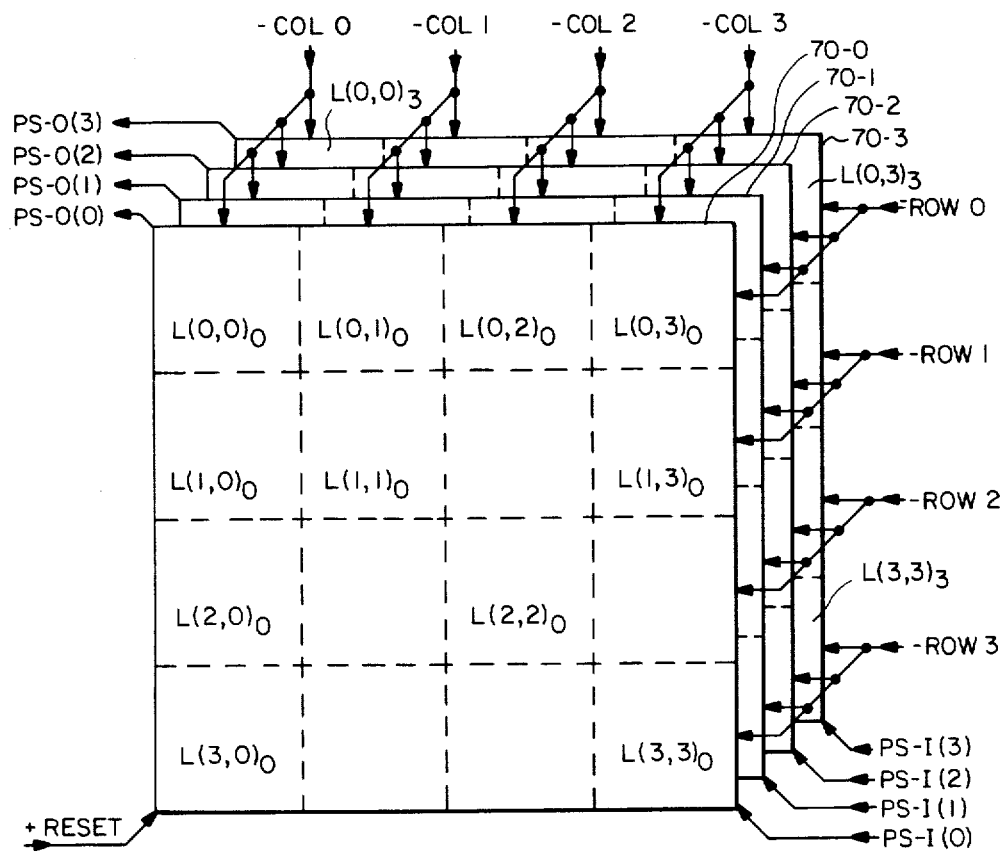
FIG. 9 depicts a multiple planes of FIG. 8 which forms the latch array on the chip of FIG. 6.

Multiplane Chip Array—FIG. 9

In FIG. 9, four planes of FIG. 8 are combined to form a multiplane array. The four planes are designated 70-0 (corresponding to FIG. 8), 70-1, 70-2 and 70-3. Each of the planes in FIG. 9 has latches corresponding to FIG. 8, but with a different subscript to designate the different planes. For example, the plane 70-0 has the latch L(3,3)$_0$ while the plane 70-3 has the corresponding latch L(3,3)$_3$.

Note that in FIG. 9, the column signals, COL 0, COL 1, COL 2, and COL 3 are connected in common for each of the planes 70-0, . . . , 70-3. Similarly, the ROW signals ROW 0, . . . , ROW 3 are connected in common for each of the planes 70-0, . . . , 70-3.

In FIG. 9, the RESET line is connected in common to all of the planes 70-0, . . ., 70-3 and to each latch on every plane as indicated in FIG. 8.

In FIG. 9, each plane 70-0, . . . , 70-3 has a different scan-in signal PS-I(0), . . . , PS-I(3), respectively. Similarly, each plane 70-0, . . . , 70-3 provides a different scan-out signal PS-O(0), . . . , PS-O(3).

Chip Serial Scan Operation

There are two external connections to the Serial Scan state machine:

(1) Scan Clock (input)
(2) Bidirectional Data (input/output)

For proper operation, the Serial Scan state machine must first be initialized. This is accomplished by forcing the data pin HIGH and applying 64 of scan clocks to cause the state machine to cycle through its entire state sequence. At the end of the state sequence if the input is still HIGH, the state machine will remain in the idle state.

To begin a chip scan sequence, the data pin is allowed to drop LOW for one scan clock. This will prepare the internal state machine to accept the next state of the data line as either an indication to enter scan-out mode (HIGH), or scan-in mode (LOW).

During scan-out mode, the bidirectional data pin becomes an output. Then for the remainder of the chip scan sequence, the states of internal scan points are multiplexed onto the data pin as a function of the internal state counter.

During scan-in mode, the bidirectional data pin becomes an input. Note that when the internal state machine is placed into scan-in mode, an internal reset signal is generated to place all latches with scan-in capability in known state. Then for the remainder of the scan sequence, individual latches will be selected as a function of the state counter and scan-in data. If the data pin is LOW when the Scan Clock is applied, the latch will be toggled from the initial state it was placed in after the reset is applied.

For latches that should not be reset during scan-in, the input 99 to the latch can be controlled by a line derived from the scan-in data line rather than by the + RESET line. During the scan operation, the latch behaves as a set/reset latch.

While the invention has been particularly shown and described with reference to preferred embodiments thereof, it will be understood by those skilled in the art that the foregoing and other changes in form and details may be made therein without departing from the spirit and scope of the invention.

What is claimed is:

1. In an integrated circuit having a normal function performing sequential logic, data locations having connections for use in execution of the normal function and a plurality of input-output terminals coupled to the circuit, an apparatus for scanning the contents of the data locations independent of the connections for use in execution of the normal function comprising:

data line means, in communication with a first of the input-output terminals and the data locations, for selectively connecting the data locations to the first input-output terminal across connections separate from the connections for use in execution of the normal function;

sequencer means for generating scan sequence signals identifying data locations to be scanned, wherein a second of the input-output terminals is connected to receive a scan clock signal, and the sequencer means is responsive to the scan clock signal for controlling the timing of the generation of the scan sequence signals;

decoder means, in communication with the data line means and the sequencer means and responsive to the scan sequence signals, for controlling the selective connection of the data line means to the data locations identified by the scan sequence signals; and control logic, in communication with the sequencer means and connected to the first input-output terminal for receiving control input signals and to the second input-output terminal for receiving the scan clock signal, for controlling the sequencer means.

2. In an integrated circuit having a normal function performing sequential logic, data locations having connections for use in execution of the normal function and a plurality of input-output terminals coupled to the circuit, an apparatus for scanning the contents of the data locations independent of the connections for use in execution of the normal function comprising:

data line means, in communication with a first of the input-output terminals and the data locations, for selectively connecting the data locations to the first input-output terminal across connections separate from the connections for use in execution of the normal function;

sequencer means for generating scan sequence signals identifying data locations to be scanned;

decoder means, in communication with the data line means and the sequencer means and responsive to the scan sequence signals, for controlling the selective connection of the data line means to the data locations identified by the scan sequence signals; and control logic, in communication with the sequencer means, for controlling the sequencer means; wherein each of the data locations comprises:

a sample and hold latch circuit, the connections for use in execution of the normal function including data-in and data-out lines, a clock sample input line, and a clock hold input line; the sample and hold latch circuit further including row and column input lines, connected to receive signals from the decoder means, for accessing the latch circuit; and a scan-out gate connected to the data line means enabled by said row and column input lines, providing a scan-out of the latch circuit.

3. The scan apparatus of claim 2, wherein the latch circuit further includes a scan-in line for scanning in data to the latch circuit under control of said row and column input lines.

4. The scan apparatus of claim 2, wherein the latch circuit further includes a reset input.

* * * * *